United States Patent
Gambino et al.

(10) Patent No.: US 9,543,356 B2
(45) Date of Patent: Jan. 10, 2017

(54) PIXEL SENSOR CELL INCLUDING LIGHT SHIELD

(75) Inventors: Jeffrey P. Gambino, Westford, VT (US); Mark D. Jaffe, Shelburne, VT (US); John Ellis-Monaghan, Grand Isle, VT (US); Richard Rassel, Essex Junction, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 1275 days.

(21) Appl. No.: 12/538,194

(22) Filed: Aug. 10, 2009

(65) Prior Publication Data

US 2010/0230729 A1 Sep. 16, 2010

Related U.S. Application Data

(60) Provisional application No. 61/158,769, filed on Mar. 10, 2009.

(51) Int. Cl.
*H01L 27/148* (2006.01)
*H01L 27/146* (2006.01)

(52) U.S. Cl.
CPC ..... *H01L 27/14689* (2013.01); *H01L 27/1464* (2013.01); *H01L 27/14609* (2013.01); *H01L 27/14623* (2013.01)

(58) Field of Classification Search
CPC ............ H01L 27/14609; H01L 27/14623; H01L 27/1464; H01L 27/14689
USPC ........... 257/228, 292, 435, E27.133, E27.15,257/E31.122, E21.211, 447, 460; 438/69
See application file for complete search history.

(56) References Cited

U.S. PATENT DOCUMENTS

| | | | |
|---|---|---|---|
| 5,244,817 A | 9/1993 | Hawkins et al. | |
| 5,852,322 A | 12/1998 | Speckbacher | |
| 6,168,965 B1 | 1/2001 | Malinovich et al. | |
| 6,169,319 B1 | 1/2001 | Malinovich et al. | |
| 6,285,018 B1 | 9/2001 | Aebi et al. | |
| 6,489,992 B2 | 12/2002 | Savoye | |
| 7,005,637 B2 | 2/2006 | Costello et al. | |
| 2007/0069258 A1* | 3/2007 | Ahn | 257/290 |
| 2007/0171318 A1* | 7/2007 | Lai | 349/42 |

(Continued)

FOREIGN PATENT DOCUMENTS

| | | |
|---|---|---|
| JP | H02194558 A | 8/1990 |
| JP | 2007228460 A | 9/2007 |

(Continued)

*Primary Examiner* — Meiya Li
(74) *Attorney, Agent, or Firm* — Scully, Scott, Murphy & Presser, P.C.

(57) ABSTRACT

CMOS image sensor pixel sensor cells, methods for fabricating the pixel sensor cells and design structures for fabricating the pixel sensor cells are designed to allow for back side illumination in global shutter mode by providing light shielding from back side illumination of at least one transistor within the pixel sensor cells. In a first particular generalized embodiment, a light shielding layer is located and formed interposed between a first semiconductor layer that includes a photoactive region and a second semiconductor layer that includes the at least a second transistor, or a floating diffusion, that is shielded by the light blocking layer. In a second generalized embodiment, a thin film transistor and a metal-insulator-metal capacitor are used in place of a floating diffusion, and located shielded in a dielectric isolated metallization stack over a carrier substrate.

6 Claims, 17 Drawing Sheets

(56) References Cited

U.S. PATENT DOCUMENTS

2007/0296006 A1* 12/2007 Adkisson et al. ............ 257/292
2008/0017946 A1* 1/2008 Cazaux et al. ................ 257/447
2008/0093695 A1* 4/2008 Gao et al. ..................... 257/428
2010/0148289 A1* 6/2010 McCarten et al. ............ 257/432

FOREIGN PATENT DOCUMENTS

| JP | 2008042825 A | 2/2008 |
| JP | 2008060195 A | 3/2008 |

\* cited by examiner

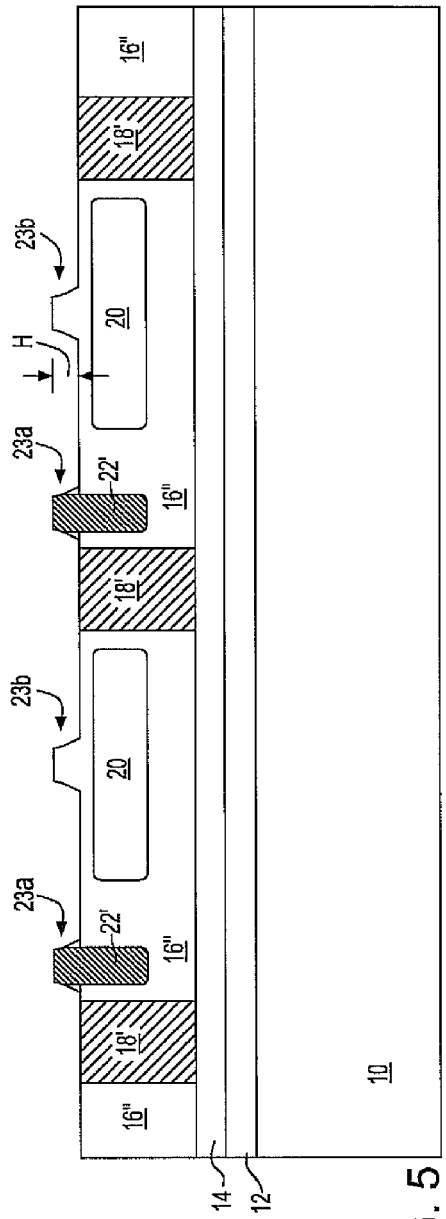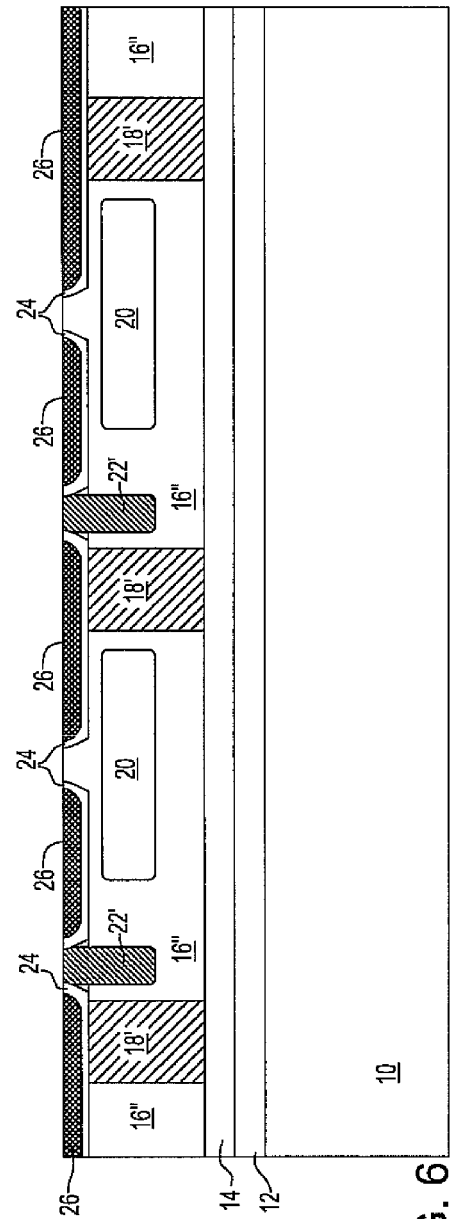

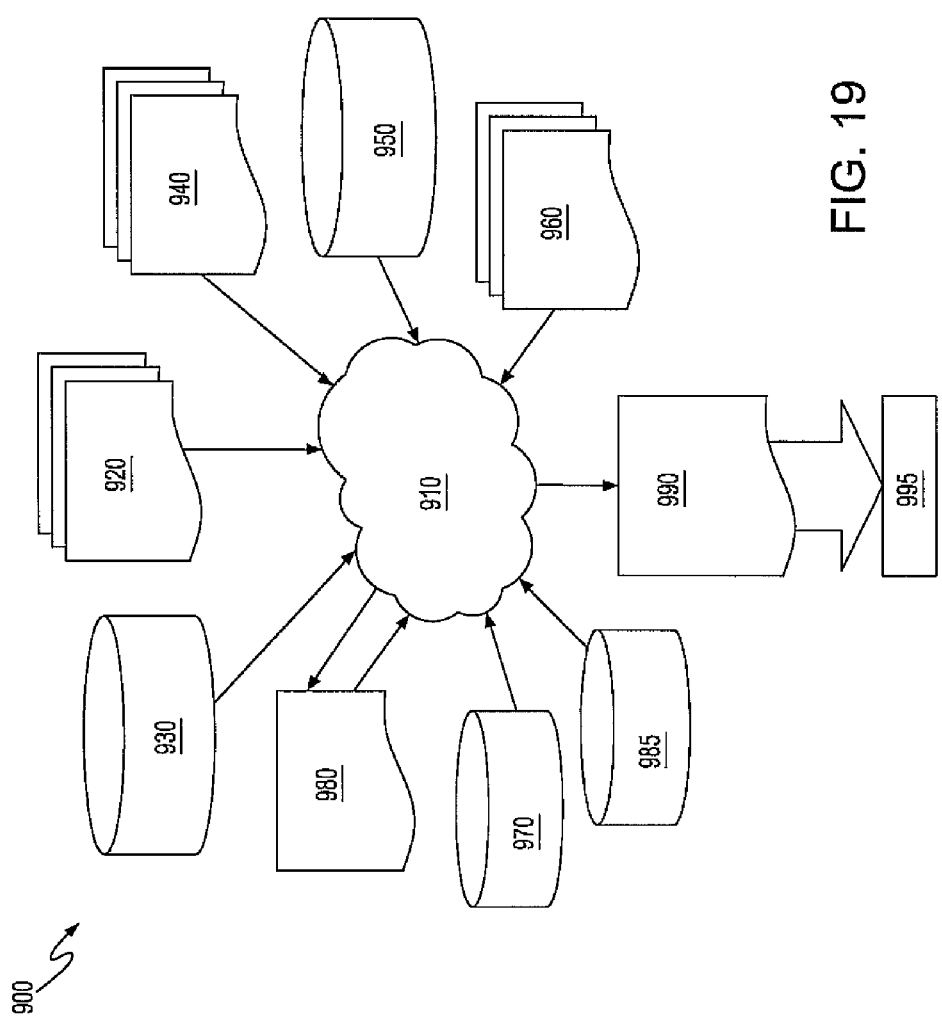

PIXEL SENSOR CELL INCLUDING LIGHT SHIELD

Applicant claims the benefit of Provisional Application Ser. No. 61/158,769, Pixel Sensor Cell Including Light Shield, filed on Mar. 10, 2009.

BACKGROUND

The invention relates generally to pixel sensor cells, methods for fabrication thereof and design structures for fabrication thereof. More particularly, the invention relates to back side illuminated pixel sensor cells intended for use in global shutter mode, with enhanced light shielding.

Solid state sensors are popular optoelectronic components that find use in various technology applications, including in particular imaging technology applications. Particularly common are solid state sensors that are used as active light capture and imaging elements within digital cameras.

Solid state image sensors may be fabricated using any of several semiconductor technologies for the active light capture and imaging elements. Charge coupled devices are known as more traditional solid state image sensor light capture and imaging elements. Complementary metal oxide semiconductor (CMOS) devices provide yet another semiconductor based active light capture and imaging element for use within a solid state image sensor. Solid state image sensors predicated upon CMOS semiconductor devices are generally desirable insofar as such CMOS based solid state image sensors may consume less power in comparison with other types of solid state image sensors.

While solid state image sensors in general, and CMOS image sensors more particularly, are desirable within the optoelectronic component fabrication art, solid state image sensors in general; and CMOS image sensors more particularly, are not entirely without problems. In particular, performance enhancements, such as charge transfer performance enhancements, and spurious light immunity enhancements, are often desirable within solid state sensors in general and solid state image sensors more particularly, in order to assure accurate and timely charge transfer and imaging characteristics.

Two interesting types of CMOS sensors which have seen a lot of attention recently are back side illuminated sensors and global shutter sensors. Back side illuminated sensors receive their light from the bottom or back side of the wafer. For this reason, there is no interference to the incoming light from the metallization which is on top of the silicon. This can yield high quantum efficiency and high angular response. Global shutter image sensors can operate in a mode to expose the entire array simultaneously, thereby eliminating image motion artifacts. In global shutter image sensors, the charge collected in the photodiode in each pixel must be stored on a capacitor within the pixel after the exposure and before the readout. This capacitor must be shielded so that incidental light does not add to the stored charge during the readout time. This is accomplished by a light shield which is usually created by a metal layer above the diffusion connected to or comprising the capacitor, and an electron shield comprised of a potential barrier made by ion implanting dopant underneath the diffusion connected to or comprising the capacitor. The back side illuminated imager technology is not often combined with the global shutter imager technology due to the difficulty of creating a light shield which is effective at preventing back side light from adding to the charge stored on the capacitor.

Various solid state sensor structures and designs, and methods for fabrication thereof, are known in the optoelectronic art.

Foe example, Hawkins, in U.S. Pat. No. 5,244,817, teaches a cost effective method for fabricating a backside image sensor. This particular method may be characterized as a layer transfer method that includes the use of a sacrificial substrate as well as a subsequently affixed carrier substrate.

In addition, Speckbacher et al., in U.S. Pat. No. 5,852,322, teaches another image sensor and method for fabricating the image sensor. This particular image sensor includes backside electrode contacts within the image sensor.

Further, Malinovich et al., in U.S. Pat. No. 6,168,965, teaches an economically manufacturable backside illuminated image sensor. This particular backside illuminated image sensor uses a glass layer lamination method.

Still further, Aebi et al., in U.S. Pat. No. 6,285,018, teaches a pixel sensor cell that allows for low light operation. This particular pixel sensor cell uses a photocathode generated electron bombardment of an active pixel sensor.

Still further, Savoye, in U.S. Pat. No. 6,489,992, teaches a charge coupled device image sensor having a large field of view. This particular image sensor uses a short focal length lens.

Finally, Costello et al., in U.S. Pat. No. 7,005,637, teaches an electron bombardment image sensor with enhanced performance. This particular electron bombardment image sensor uses a selective area backside thinning.

Solid state sensors, including charge coupled device (CCD) image sensors and further including in particular complementary metal oxide semiconductor (CMOS) image sensors, are likely to be of continued interest and continued importance as solid state sensor technology advances. Thus, desirable are solid state sensors, methods for fabrication thereof and design structures for fabrication thereof, as well as related component sub-structures, that provide for improved performance, including image discrimination.

BRIEF SUMMARY

This invention teaches a structure to create a light shield which will work for a back side illuminated imager thus allowing for the creation of a global shutter back side illuminated imager. More particularly, the invention provides a pixel sensor cell, a method for fabricating the pixel sensor cell and a design structure for fabricating the pixel sensor cell. The pixel sensor cell, which includes therein a light blocking layer, typically but not exclusively, comprises a complementary metal oxide semiconductor (CMOS) pixel sensor cell. Within a particular embodiment, the light blocking layer is located interposed between a first semiconductor layer spaced further from a carrier substrate that includes a photoactive region and a second semiconductor layer spaced closer to the carrier substrate that includes at least in-part a second transistor, and preferably also a floating diffusion, that is shielded by the light blocking layer. Within another particular embodiment, the light blocking layer is located to shield, within a dielectric isolated metallization stack, a thin film transistor and a metal-insulator-metal capacitor that are used in place of a floating diffusion within the pixel sensor cell. Within either of the particular embodiments, the light blocking layer avoids spurious light effects within either of the particularly disclosed pixel sensor cells.

A particular pixel sensor cell in accordance with the invention includes a second transistor located within a second semiconductor layer located over a carrier substrate.

This particular pixel sensor cell also includes a photoactive region located within a first semiconductor layer located over the second semiconductor layer and the carrier substrate. This particular pixel sensor cell also includes a light blocking layer located interposed between the first semiconductor layer and the second semiconductor layer and shielding the second transistor.

Another particular pixel sensor cell in accordance with the invention includes a dielectric isolated metallization stack located over a carrier substrate and including a thin film transistor and a metal-insulator-metal capacitor that are shielded by a light blocking layer. This other particular pixel sensor cell also includes a semiconductor layer located over the dielectric isolated metallization stack and the carrier substrate and including a photoactive region.

A particular design structure for a pixel sensor cell in accordance with the invention includes a design structure embodied in a machine readable medium for designing, manufacturing, or testing an integrated circuit, the design structure comprising a pixel sensor cell that includes a second transistor located within a second semiconductor layer located over a carrier substrate. The pixel sensor cell also includes a photoactive region located within a first semiconductor layer located over the second semiconductor layer and the carrier substrate. The pixel sensor cell also includes a light blocking layer located interposed between the first semiconductor layer and the second semiconductor layer and shielding the second transistor.

Another particular design structure for a pixel sensor cell in accordance with the invention includes a design structure embodied in a machine readable medium for designing, manufacturing, or testing an integrated circuit, the design structure comprising a pixel sensor cell that includes a dielectric isolated metallization stack located over a carrier substrate and including a thin film transistor and a metal-insulator-metal capacitor that are shielded by a light blocking layer. The pixel sensor cell also includes a semiconductor layer located over the dielectric isolated metallization stack and the substrate and including a photoactive region.

A particular method for fabricating a pixel sensor cell in accordance with the invention includes forming over a sacrificial substrate a first semiconductor layer that includes a photoactive region. This particular method also includes forming over the first semiconductor layer a light blocking layer. This particular method also includes forming over the light blocking layer a second semiconductor layer that includes at least in part a second transistor that is shielded by the light blocking layer. This particular method also includes affixing a carrier substrate over the second semiconductor layer. This particular method also includes removing the sacrificial substrate.

Another particular method for fabricating a pixel sensor cell in accordance with the invention includes forming over a sacrificial substrate a first semiconductor layer that includes a photoactive region. This other particular method also includes forming over the first semiconductor layer a dielectric isolated metallization stack including a thin film transistor and a metal-insulator-metal capacitor that are shielded by a light blocking layer. This other particular method also includes affixing a carrier substrate over the dielectric isolated metallization stack. This other particular method also includes removing the sacrificial substrate.

BRIEF DESCRIPTION OF THE SEVERAL VIEWS OF THE DRAWINGS

The objects, features and advantages of the invention are understood within the context of the Detailed Description, as set forth below. The Detailed Description is understood within the context of the accompanying drawings, which form a material part of this disclosure, wherein:

FIG. 3 to FIG. 9 shows a series of schematic cross-sectional diagrams illustrating the results of progressive stages in fabricating a CMOS pixel sensor cell within a semiconductor structure in accordance with a particular embodiment of the invention. This particular embodiment of the invention comprises first generalized embodiment of the invention.

FIG. 19 is a flow diagram of a design process used in semiconductor design, manufacture, and/or test.

DETAILED DESCRIPTION

The invention, which includes a pixel sensor cell, a method for fabricating the pixel sensor cell and a design structure for fabricating the pixel sensor cell, is understood within the context of the description set forth below. The description set forth below is understood within the context of the drawings described above. Since the drawings are intended for illustrative purposes, the drawings are not necessarily drawn to scale.

Figure 1:
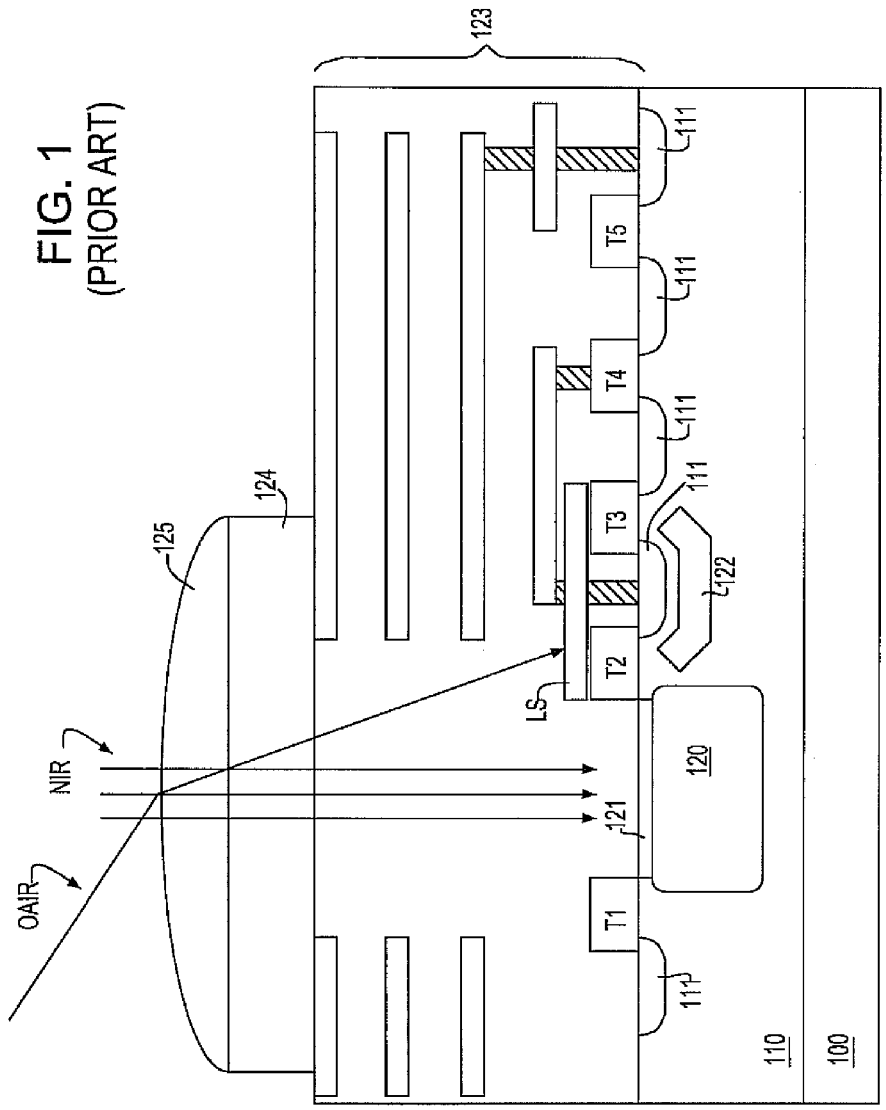
FIG. 1 shows a prior art diagram for a CMOS global shutter imaging pixel.

FIG. 1 shows the prior art for a CMOS global shutter imaging pixel. FIG. 1 shows a semiconductor substrate 100 and an epitaxial layer 110 located upon the semiconductor substrate 100. Included within the epitaxial layer 110 are transistor structures T1, T2, T3, T4 and T5 that include source/drain regions 111. Source/drain region 111 interposed between transistor T2 and transistor T3 serves as a floating diffusion with a charge collection shield 122 therebeneath. Also located upon the epitaxial layer 110 and covering the transistor structures T1 to T5 is a dielectric isolated metallization stack 123 that includes a light shield LS that spans transistor T2 and transistor T3. Located aligned above a photodiode 120 and a pinning layer 121 within the epitaxial layer 110 is a color filter layer 124 having a lens layer 125 located thereupon. As is illustrated in FIG. 1, normal incident radiation NIR is incident upon the photodiode 120, but off-axis incident radiation OAIR is incident upon the light shield LS. Within FIG. 1, the floating diffusion acts as a storage capacitor with in the pixel. Light is prevented from directly hitting the floating diffusion by an opaque layer light shield LS, which is often a metal. Electrons generated deep in the semiconductor substrate underneath the photodiode are prevented from drifting up to the floating diffusion by the charge collection shield 122 which creates an electrostatic barrier.

Figure 2:
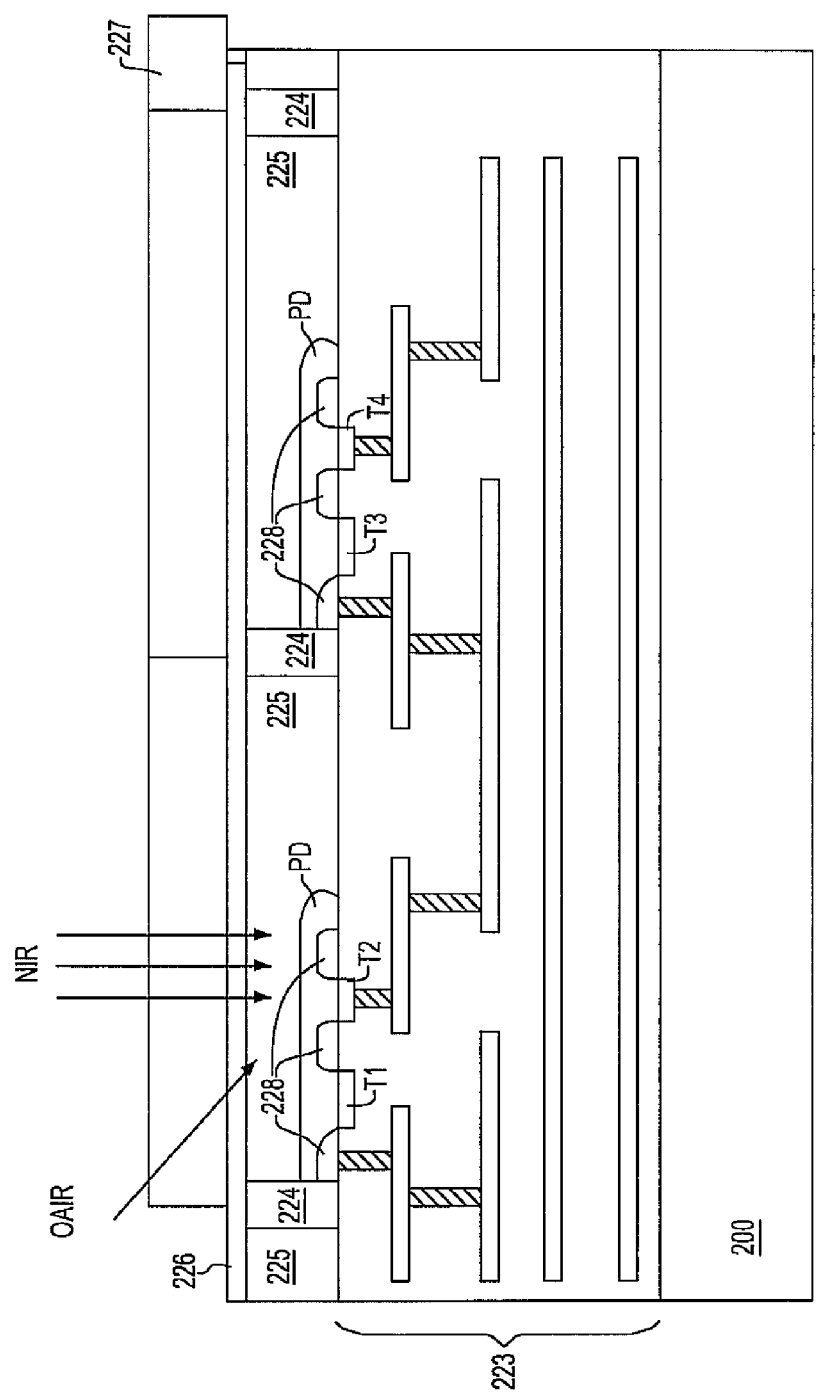
FIG. 2 shows a prior art diagram for a back side illuminated imaging pixel.

FIG. 2 shows the prior art for a back side illuminated imaging pixel. FIG. 2 shows a carrier substrate 200. A dielectric isolated metallization stack 223 is located upon the carrier substrate 200. Semiconductor regions 225 that are separated by isolation regions 224 are located upon the dielectric isolated metallization stack 223. Included in-part within the semiconductor regions 225 are transistors T1, T2, T3 and T4 that include source/drain regions 228 that overlay with photodiodes PD. A spacer layer 226 is located upon the semiconductor layers 225 and a color filter layer 227 is located upon the spacer layer 226. This pixel is illuminated from the back side of the carrier substrate 200. Since silicon is partially transparent, especially in the red portion of the spectrum, there is no way to prevent direct incidence of photons on any of the diffusions, including the source/drain diffusions and photodiode diffusions, in the pixel. Thus, both normal incident radiation NIR and off axis incident radiation OAIR are incident upon the photodiodes PD and the source/drain regions.

Figure 3:
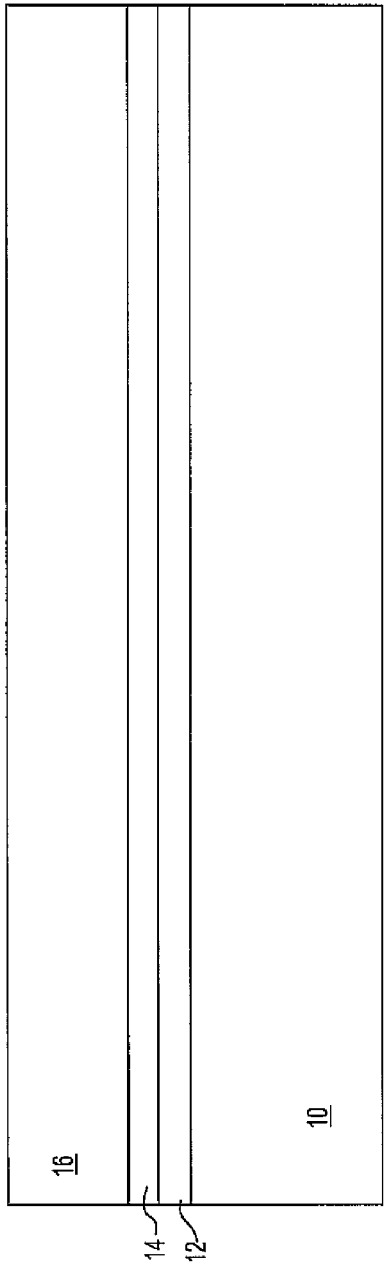

FIG. 3 to FIG. 9 show a series of schematic cross-sectional diagrams illustrating the results of progressive stages in fabricating a CMOS pixel sensor cell within a semiconductor structure in accordance with a particular generalized embodiment of the invention. This particular generalized embodiment of the invention comprises a first generalized embodiment of the invention. FIG. 3 shows a schematic cross-sectional diagram of the semiconductor structure at an early stage in the fabrication thereof in accordance with this particular first generalized embodiment of the invention.

FIG. 3 shows a semiconductor-on-insulator (SOI) substrate that includes a base semiconductor substrate 10, a first buried dielectric layer 12 located and formed upon the base semiconductor substrate 10, a second buried dielectric layer 14 located and formed upon the first buried dielectric layer 12 and a surface semiconductor layer 16 located and formed upon the second buried dielectric layer 14. Each of the foregoing semiconductor substrate 10 and layers a12/14/16 that comprise the semiconductor-on-insulator (SOI) substrate that is illustrated in FIG. 3 may comprise materials, have dimensions and be formed using methods that are otherwise generally conventional in the semiconductor fabrication art.

For example, each of the base semiconductor substrate 10 and the surface semiconductor layer 16 may comprise any of several semiconductor materials. Non-limiting examples include silicon, germanium, silicon-germanium alloy, silicon-carbon alloy, silicon-germanium-carbon alloy and compound (i.e., III-V and II-VI) semiconductor materials. Non-limiting examples of compound semiconductor materials include gallium arsenide, indium arsenide and indium phosphide semiconductor materials. The base semiconductor substrate 10 and the surface semiconductor layer 16 may comprise the same or different semiconductor materials with respect to chemical composition, dopant polarity, dopant concentration and crystallographic orientation. Typically, the base semiconductor substrate 10 has a thickness from about 0.6 to about 1 millimeters, while the surface semiconductor layer 16 has a thickness from about 1 to about 5 μm. Typically, each of the base semiconductor substrate 10 and the surface semiconductor layer 16 comprises a silicon or silicon-germanium alloy semiconductor material.

Each of the first buried dielectric layer 12 and the second buried dielectric layer 14 may separately and independently comprise any of several dielectric materials. Non-limiting examples include oxides, nitrides and oxynitrides, particularly of silicon, but oxides, nitrides and oxynitrides of other elements are not excluded. Each of the first buried dielectric layer 12 and the second buried dielectric layer 14 may comprise a crystalline or a non-crystalline dielectric material, with crystalline dielectric materials being highly preferred. Each of the first buried dielectric layer 12 and the second buried dielectric layer 14 may be formed using any of several methods. Non-limiting examples include ion implantation methods, thermal or plasma oxidation or nitridation methods, chemical vapor deposition methods and physical vapor deposition methods. Typically, the first buried dielectric layer 12 comprises a silicon nitride dielectric material that has a thickness from about 10 to about 50 nanometers, while the second buried dielectric layer 14 comprises a silicon oxide dielectric material that has a thickness from about 10 to about 50 nanometers. As is understood by a person skilled in the art, the first buried dielectric layer 12 when formed of the silicon nitride dielectric material is optional within the instant embodiment and is used to facilitate subsequent cleavage of the semiconductor substrate 10 from a completed semiconductor structure.

Although FIG. 3 illustrates the first generalized embodiment of the invention within the context of a semiconductor-on-insulator substrate comprising the base semiconductor substrate 10, the first buried dielectric layer 12, the second buried dielectric layer 14 and the surface semiconductor layer 16, neither the instant first generalized embodiment nor the invention is intended to be so limited. Rather, the instant first generalized embodiment and additional generalize embodiments, as well as the subsequent more specific embodiments resulting therefrom, may also be practiced under certain circumstances using a bulk semiconductor substrate (that would otherwise result from absence of the first buried dielectric layer 12 and the second buried dielectric layer 14 under circumstances where the base semiconductor substrate 10 and the surface semiconductor layer 16 have identical chemical composition and crystallographic orientation). Such a bulk semiconductor substrate may be made prone to cleavage using a hydrogen ion implantation method.

Figure 4:
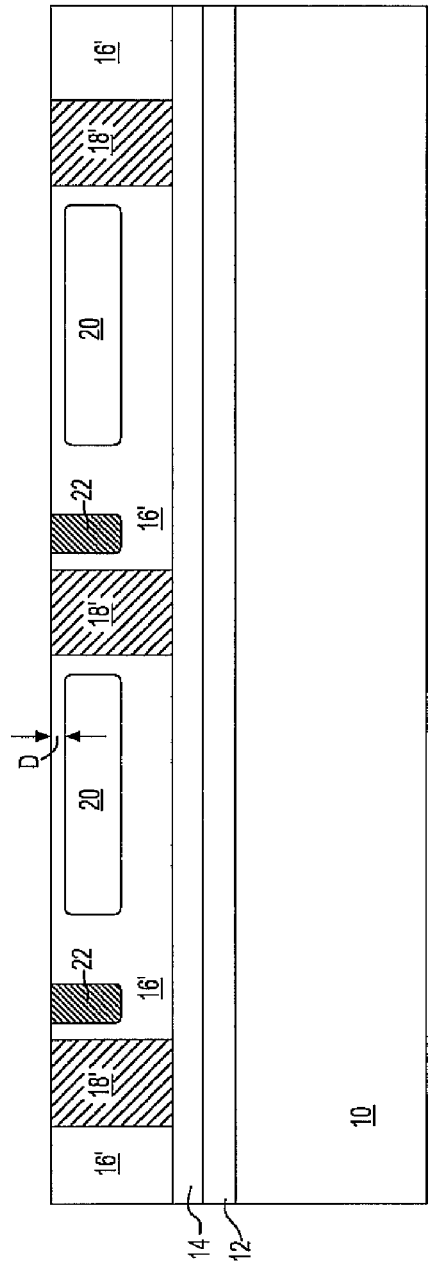

FIG. 4 first shows a plurality of surface semiconductor layers 16' that results from patterning the surface semiconductor layer 16 that is illustrated in FIG. 3. Such patterning may be effected using etch methods and materials that are otherwise generally conventional in the semiconductor fabrication art. Such etch methods and materials may include, but are not necessarily limited to, wet chemical etch methods and materials, and dry plasma etch methods and materials. Dry plasma etch methods are generally preferred in order to provide generally straight sidewalls to the surface semiconductor layers 16'.

FIG. 4 also shows a plurality of isolation regions 18 located and formed interposed between the plurality of surface semiconductor layers 16'.

The plurality of isolation regions 18 may comprise any of several isolation materials that will typically comprise dielectric isolation materials. Typically, the plurality of isolation regions 18 comprises a dielectric isolation material selected from the same group of dielectric isolation materials that may be used for the first buried dielectric layer 12 and the second buried dielectric layer 14. However a method used for fabricating the isolation regions 18 may be different from a method used for fabricating the first buried dielectric layer 12 and the second buried dielectric layer 14. Typically, the isolation regions 18 comprise a silicon oxide or a silicon nitride dielectric material, or a composite or laminate thereof, that reach the second buried dielectric layer 14.

FIG. 4 finally also shows a plurality of contact regions 22 located and formed exposed within the plurality of surface semiconductor layers 16' and whose purpose is to serve as contact to the surface semiconductor layers 16', and a plurality of photo diode regions 20 whose purpose is to serve as photo diodes located and formed embedded within the plurality of surface semiconductor layers 16', and separated from the plurality of contact regions 22.

Each of the photo diode regions 20 and each of the contact regions 22 is typically formed as a doped region, typically by ion implantation, and more particularly as an n-doped region for the photo diode regions 20 and a p-doped region for the contact regions 22, contained within a surface semiconductor layer 16' which, in turn, comprises a more lightly p-doped semiconductor material. Alternative dopant polarities are also plausible within the context of the instant particular embodiment, and of the invention. Typically, the contact regions 22 comprise a p-dopant concentration from about $1\times10^{19}$ to about $5\times10^{20}$ p-dopant atoms per cubic centimeter and the photo diode regions 20 comprise an n-dopant concentration from about $1\times10^{15}$ to about $1\times10^{17}$ n-dopant atoms per cubic centimeter, while the remaining portions of the surface semiconductor layers 16' comprise a p-dopant concentration from about $1\times10^{13}$ to about $1\times10^{16}$ p-dopant atoms per cubic centimeter. As is illustrated within the schematic cross-sectional diagram of FIG. 4, the photo diode regions 20 are typically recessed within the surface semiconductor layers 16' by a distance D. There are other potential doping regions which are not shown in FIG. 4 which may include pinning layers to minimize dark currents and facilitate low light operation of a CMOS pixel sensor cell.

FIG. 5 shows the results of further processing of the semiconductor structure of FIG. 4.

FIG. 5 shows the results of etching back the semiconductor structure of FIG. 4, which is intended as a masked etching back of the semiconductor structure. The etching back provides a plurality of surface semiconductor layers 16" from the plurality of surface semiconductor layers 16', a plurality of isolation regions 18' from the plurality of isolation regions 18 and a plurality of contact regions 22' from the plurality of contact regions 22. As is illustrated within the schematic cross-sectional diagram of FIG. 5, the plurality of contact regions 22' includes a plurality of mesas 23a that arise from a lower lying surface of the surface semiconductor layers 16". In addition, the plurality of surface semiconductor layers 16" includes a plurality of mesas 23b that arise from a lower lying surface within the surface semiconductor layers 16" and are overlapped horizontally by the photo diode regions 20. Typically, each of the mesas 23a and 23b rises above lower lying horizontal portions of the surface semiconductor layers 16" by a height H while having a linewidth from about 0.2 to about 2 microns, although other distances are contemplated.

Such a masked etching back of the semiconductor structure of FIG. 4 to provide the semiconductor structure of FIG. 5 may be effected using methods and materials that are otherwise generally conventional in the semiconductor fabrication art. Included in particular, but by no means limiting, are wet chemical etch methods and materials and dry plasma etch methods and materials. Related mask materials that may be used with the wet chemical etch methods or the dry plasma etch methods may include, but are not necessarily limited to photoresist mask materials and hard mask materials.

FIG. 6 shows the results of further processing of the semiconductor structure of FIG. 5.

FIG. 6 shows a liner layer 24 located and formed upon exposed portions of the surface semiconductor layers 16" including the mesas 23a and 23b, as well as the isolation regions 18'. FIG. 6 also shows a light blocking layer 26 located and formed upon the liner layer 24. Within FIG. 6, the liner layer 24 and the light blocking layer 26 are both planarized to the level of the mesas 23a and 23b.

The liner layer 24 is intended as comprising an insulating material. In addition, although not specifically illustrated, the light blocking layer 26 typically, but not necessarily exclusively, comprises a conductor material.

The liner layer 24 may be formed using methods and materials that are otherwise generally conventional in the semiconductor fabrication art, and similar to the methods and materials that are used for forming other dielectric layers within the semiconductor structure of FIG. 6. Typically, the liner layer 24 may comprise a silicon oxide liner material that has a thickness from about 10 to about 50 nanometers.

The light blocking layer 26 may comprise materials including but not limited to certain metals, metal alloys, metal nitrides and metal silicides that have appropriate light blocking characteristics, and that may be formed using generally conventional methods. Exemplary, but by no means limiting examples include tungsten, titanium and tantalum metals, metal alloys, metal nitrides and metal silicides. Typically, the light blocking layer 26 has a thickness from about 50 to about 500 nanometers.

The liner layer 24 and the light blocking layer 26 may result from planarizing corresponding blanket layers to the level of the mesas 23a and 23b while using planarizing methods that are conventional in the semiconductor fabrication art. Included in particular, but also not limiting, are mechanical planarizing methods and chemical mechanical polish planarizing methods.

Figure 7:
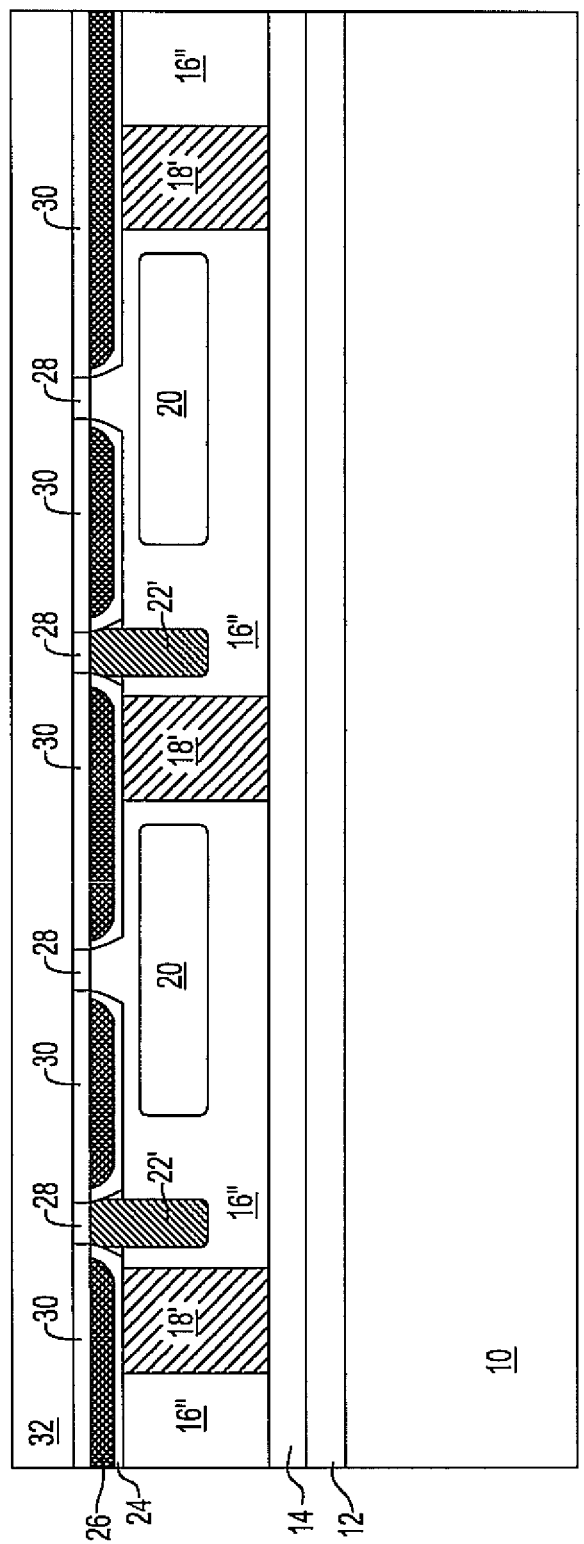

FIG. 7 first shows a plurality of conductor layers 28 located and formed contacting the plurality of mesas 23a and 23b. The plurality of conductor layers 28 is separated by a plurality of dielectric layers 30. FIG. 7 finally shows a semiconductor layer 32 located and formed upon the plurality of conductor layers 28 that is separated by the plurality of dielectric layers 30.

Each of the plurality of conductor layers 28 typically and preferably comprises materials and may be formed using methods, analogous, equivalent or identical to the materials and methods that are used for fabricating the other conductor structures within the semiconductor structure whose schematic cross-sectional diagram is illustrated in FIG. 7, such as, for example, the contact layers 22' or the light blocking layer 26. Each of the plurality of dielectric layers 30 comprises materials and may be formed using methods that are analogous, equivalent or identical to the materials and methods from which may be comprised the other dielectric materials within the semiconductor structure of FIG. 7, such as, for example, the isolation regions 18'. Finally, the semiconductor layer 32 may comprise a semiconductor material, have dimensions, and be formed using methods analogous, equivalent or identical to the methods and materials that are used for forming, for example, the surface semiconductor layer 16 as is illustrated in FIG. 3. Desirably, the semiconductor layer 32 is laminated as a single crystal semiconductor material layer. Alternatively, the semiconductor layer 32 may comprise a polycrystalline semiconductor material. Typically, each of the conductor layers 28 and the dielectric layers 30 has a thickness from about 10 to about 40 nanometers, while the semiconductor layer 32 has a thickness from about 20 to about 60 nanometers.

To fabricate the semiconductor structure of FIG. 7 from the semiconductor structure of FIG. 6, either of the conductor layers 28 or the dielectric layer 30 is first formed and patterned from a corresponding blanket layer, and then a correlating blanket layer is formed and planarized to form the other of the conductor layers 28 and the dielectric layer 30. The semiconductor layer 32 may then be formed layered (i.e., possibly laminated) upon this resulting intermediate structure to provide the semiconductor structure of FIG. 7.

Figure 8:
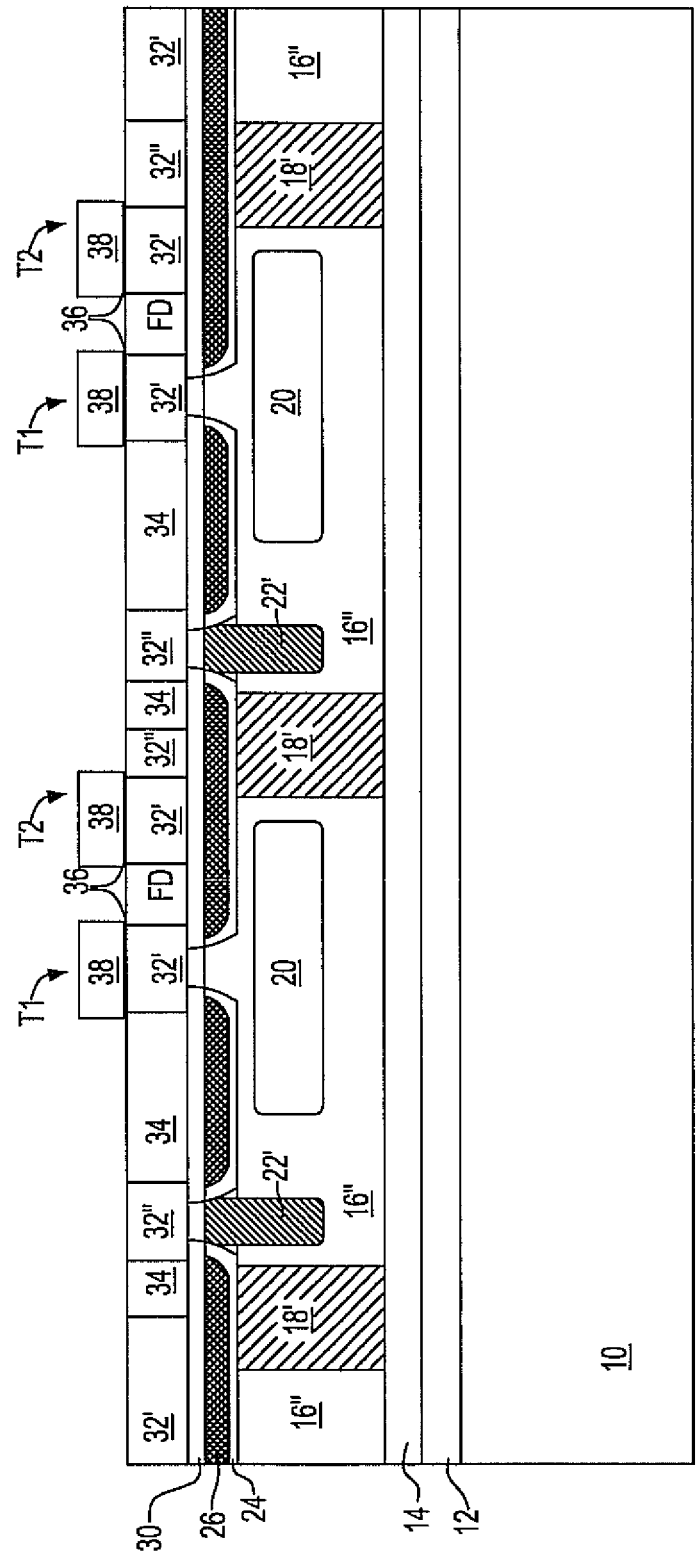

FIG. 8 shows the results of processing the semiconductor layer 32 to form channel regions 32', contact regions 32" and floating diffusion regions FD. Interposed between particular channel regions 32' that are capped with gate dielectrics 36 and gates 38 to form transistors T1 and T2 are the floating diffusion regions FD. Also shown laterally isolating particular contact layers 32" are dielectric layers 34. Dopant levels within the channel regions 32' are chosen to provide appropriate threshold voltages for the transistors. Dopant levels within the contact regions 32" and the floating diffusion regions FD are generally conventional. The dielectric layers 34 may comprise materials and be formed using methods analogous, equivalent or identical to the materials and methods used for forming the isolation regions 18'. Methods and materials for forming the gate dielectrics 36 are discussed in further detail below. Methods and materials for forming the gates 38 may be similar to the methods and materials for forming the light blocking layer 26, and may also include, but are also not necessarily limited to polysilicon gate materials and polycide gate materials. Typically, each of the gates 38 has a thickness from about 100 to about 300 nanometers, although other thicknesses are contemplated.

Figure 9:
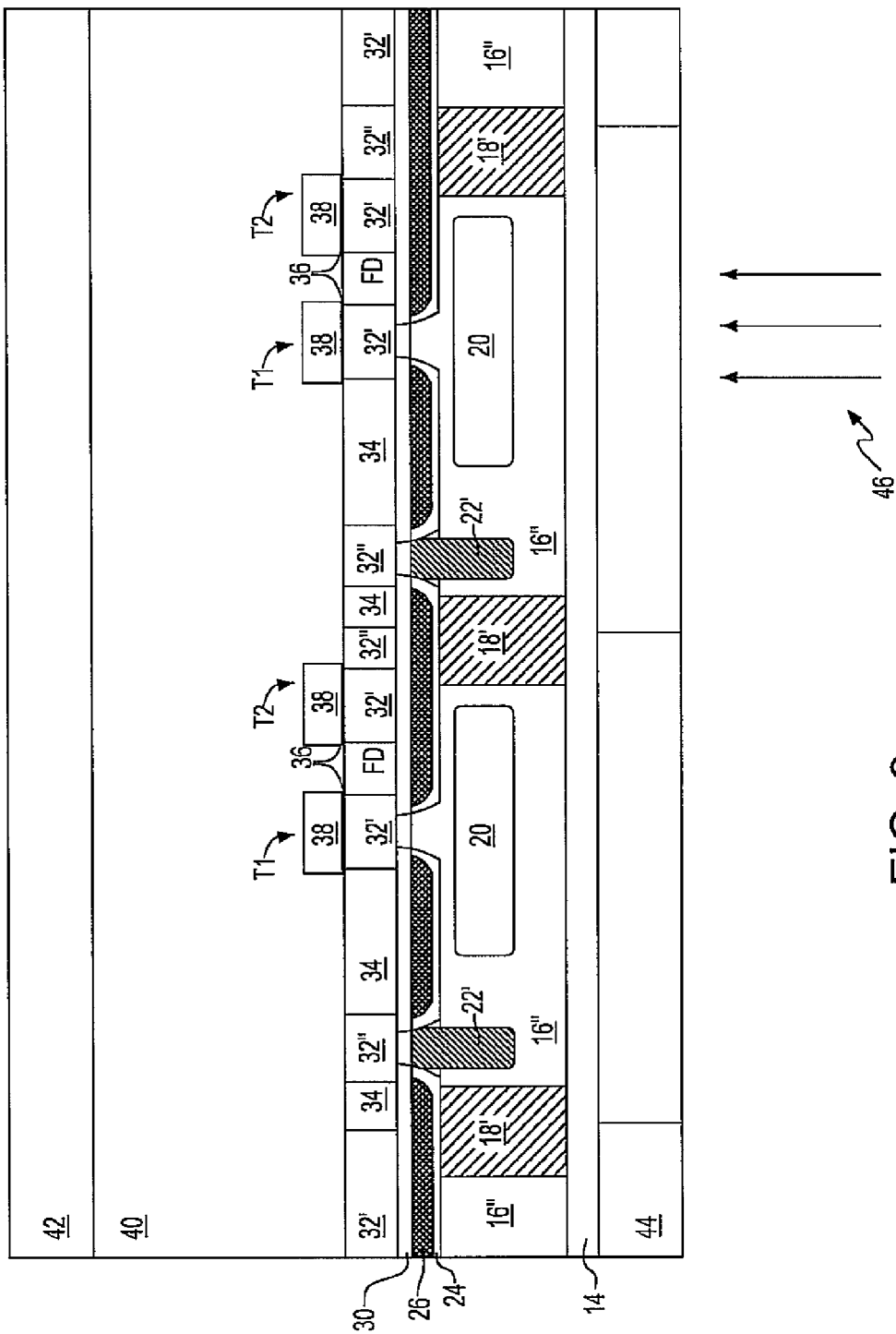

FIG. 9 first shows the results of forming a dielectric isolated metallization stack 40 upon the semiconductor structure of FIG. 8. FIG. 9 also shows a carrier substrate 42 located and formed laminated to the dielectric isolated metallization stack 40.

The dielectric isolated metallization stack 40 may comprise individual dielectric layers and metallization layers that are otherwise generally conventional in the semiconductor fabrication art, and that are not otherwise illustrated in further detail within the schematic cross-sectional diagram of FIG. 9, but will be illustrated in a generalized manner in a subsequent schematic cross-sectional diagram. The carrier substrate 42 may comprise, but is not necessarily limited to, a semiconductor substrate that is analogous, equivalent or identical to the base semiconductor substrate 10 that is illustrated in FIG. 3, which is intended as a sacrificial substrate.

FIG. 9 next shows the results of severing the base semiconductor substrate 10 and the first buried dielectric layer 12 from the semiconductor structure of FIG. 8. The base semiconductor substrate 10 and the first buried dielectric layer 12 may be severed from the semiconductor structure of FIG. 8 to provide in-part the semiconductor structure of FIG. 9 while using methods including but not limited to wet etching of the substrate 10 and mechanical grinding of the substrate 10, as well as the first buried dielectric layer 12. Typically, the first buried dielectric layer 12 will act as an etch stop for removal of the substrate 10. After the substrate 10 is removed, first buried dielectric layer 12 will also be removed.

FIG. 9 next shows a color filter layer 44 located and formed upon the second buried dielectric layer 14 after having severed therefrom the base semiconductor substrate 10 and the first buried dielectric layer 12, to thus provide a completed semiconductor structure that comprises a backside CMOS image sensor that includes multiple CMOS pixel sensor cells. FIG. 9 also shows an incident radiation beam 46 that is incident upon a particular pixel sensor cell within the backside CMOS image sensor. The color filter layer 44 may comprise any of several color filter materials. Particular examples include, but are not necessarily limited to, dyed or pigmented materials that, otherwise absent the dye or pigment, are optically transparent to the incident radiation beam 46. Typically, the color filter layer 44 comprises red, green and blue color filter segments, that each have a thickness from about 600 to about 1400 nanometers.

FIG. 9 shows a schematic cross-sectional diagram of a semiconductor structure that includes a CMOS pixel sensor cell in accordance with a particular first generalized embodiment of the invention. The CMOS pixel sensor cell includes a light blocking layer 26 located and formed interposed between and separating a photo diode region 20 within a surface semiconductor layer 16" (i.e., a first semiconductor layer) from at least in-part a transistor T1 or T2, or a floating diffusion region FD within a second semiconductor layer 32. Due to that shielding of the transistor T1 or T2, or the floating diffusion region FD, from incoming radiation 46, this particular first generalized embodiment provides enhanced performance of the CMOS pixel sensor cell within the semiconductor structure.

FIG. 10 to FIG. 13 show a series of schematic cross-sectional diagrams illustrating the results of progressive stages in fabricating a semiconductor structure in accordance with a first more specific embodiment of the invention that derives from the foregoing first generalized embodiment of the invention.

Figure 10:
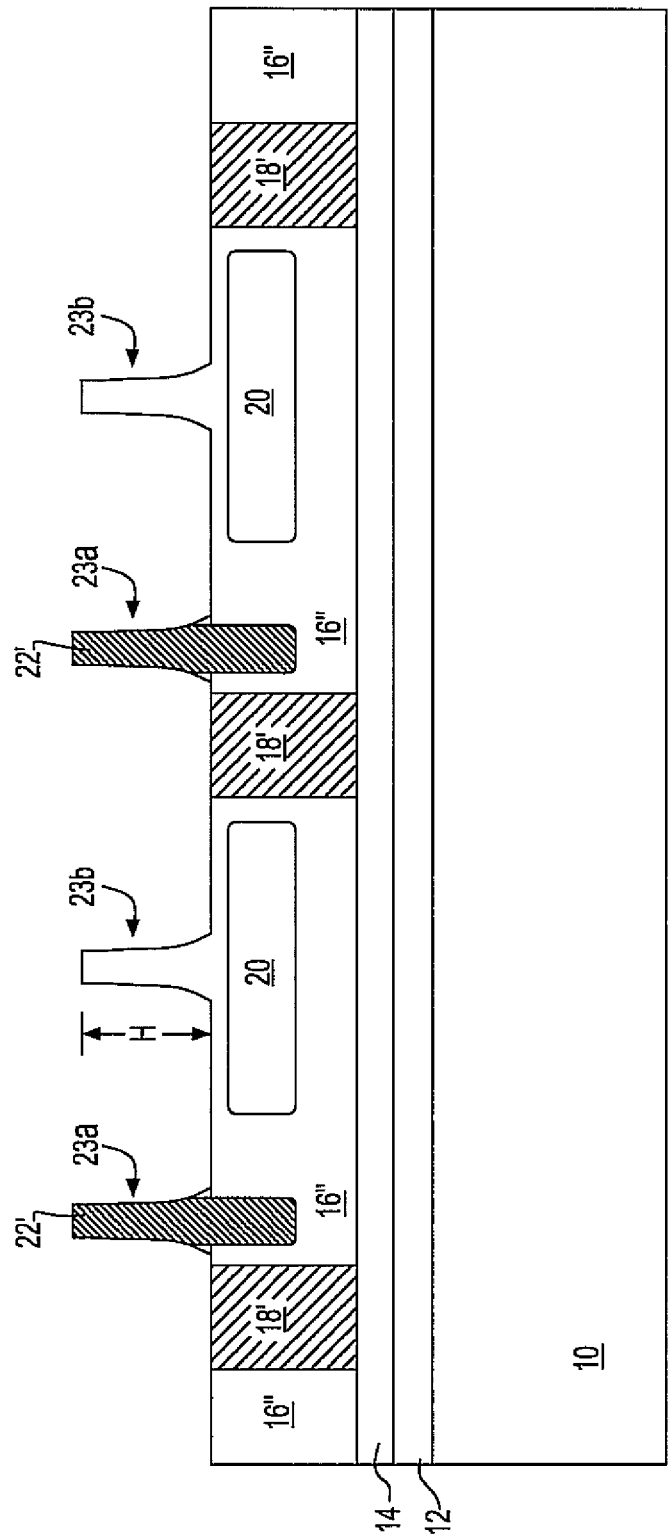
FIG. 10 to FIG. 13 show a series of schematic cross-sectional diagrams illustrating the results of progressive stages in fabricating a CMOS pixel sensor cell within a semiconductor structure in accordance with a first more specific embodiment of the invention derived from the first generalized embodiment of the invention.

FIG. 10 corresponds generally with FIG. 5, but with mesas 23a and 23b that are generally illustrated as elongated and rise above lower lying horizontal portions of the surface semiconductor layers 16" by a height H which is typically from about 0.4 to 1.5 microns. Like or identical structures or layers within FIG. 10 and FIG. 5 are designated identically.

Figure 11:
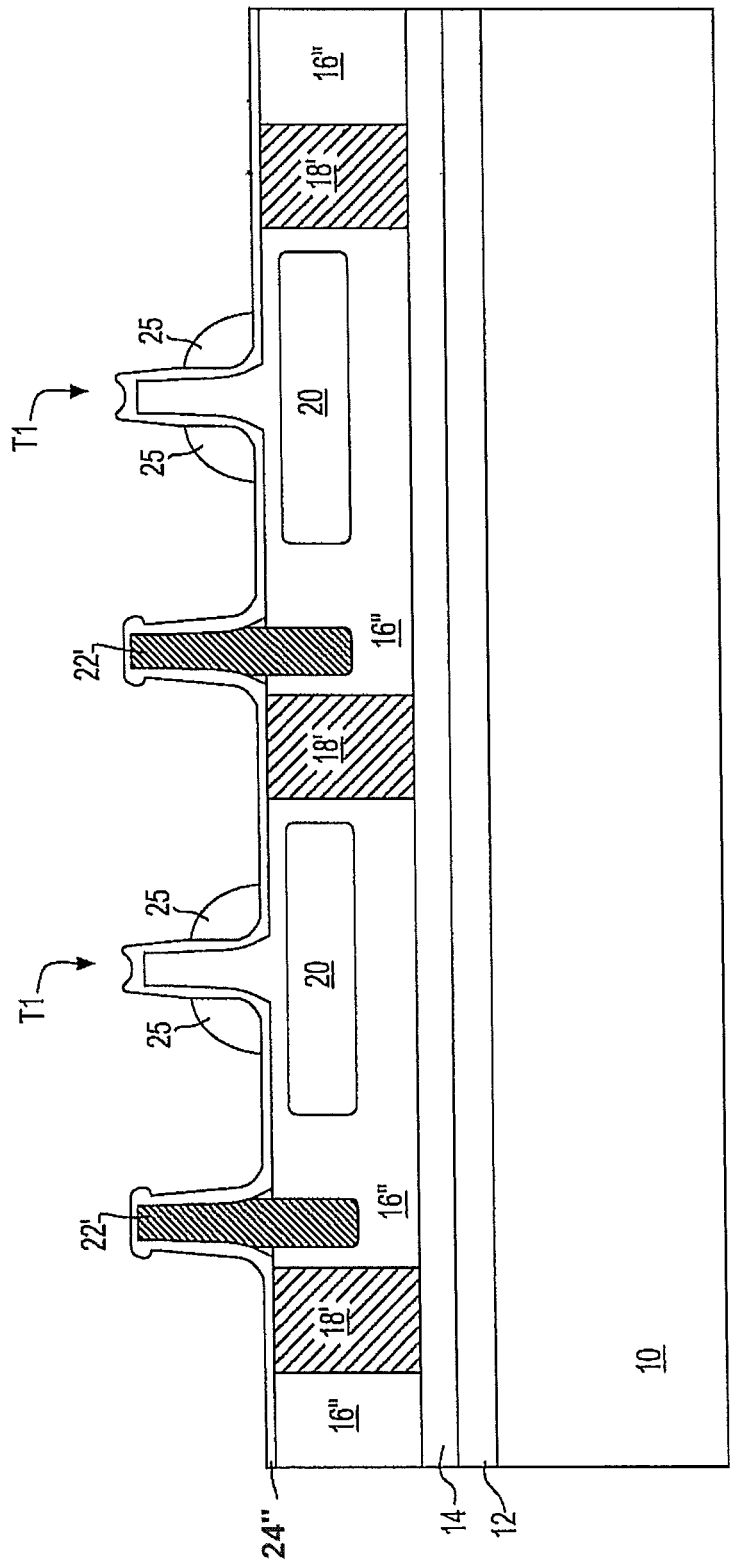

FIG. 11 corresponds generally with FIG. 6, and includes a liner layer 24' that is intended as a gate dielectric, where the liner layer 24' is located and formed upon the semiconductor structure of FIG. 10, including in particular the mesas 23a and 23b.

The liner layer 24', which comprises the gate dielectric, may comprise conventional gate dielectric materials such as oxides, nitrides and oxynitrides of silicon that have a dielectric constant from about 4 (i.e., typically a silicon oxide) to about 8 (i.e., typically a silicon nitride), measured in vacuum. Alternatively, the liner layer 24' may comprise generally higher dielectric constant dielectric materials having a dielectric constant from about 8 to at least about 100. Such higher dielectric constant dielectric materials may include, but are not limited to hafnium oxides, hafnium silicates, zirconium oxides, lanthanum oxides, titanium oxides, barium-strontium-titanates (BSTs) and lead-zirconate-titanates (PZTs). The liner layer 24' may be formed using any of several methods that are appropriate to its material of composition. Non-limiting examples include thermal or plasma oxidation or nitridation methods, chemical vapor deposition methods (including atomic layer deposition methods) and physical vapor deposition methods.

FIG. 1 also shows a plurality of spacers 25 located upon the liner layer 24' adjacent the mesas 23b. The spacers 25 are intended as conductive spacers, and in conjunction with the mesas 23b as a channel and the liner layer 24' as a gate dielectric, the spacers 25 as a gate provide transistors T1 within the semiconductor structure of FIG. 11.

Figure 12:
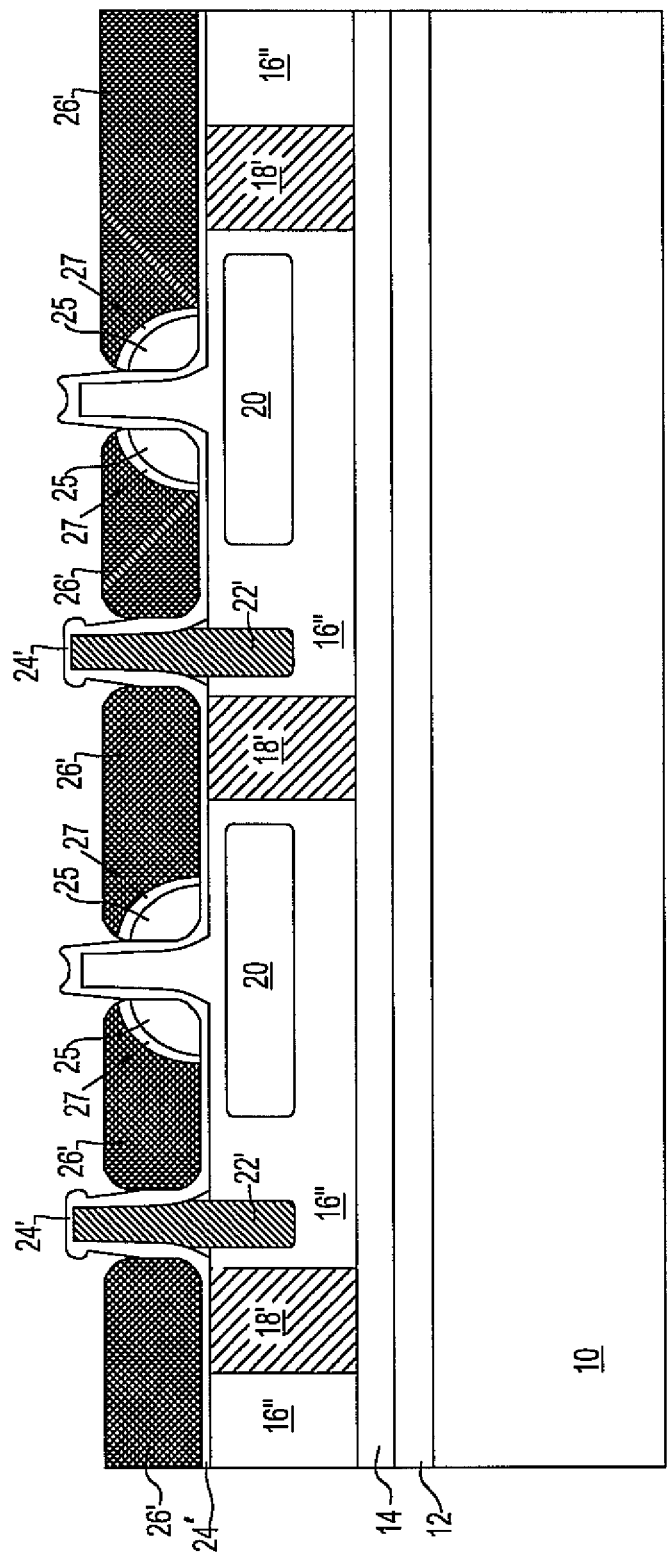

FIG. 12 otherwise corresponds with FIG. 6 and shows the light blocking layers 26' that are separated from the conductive spacers 25 by dielectric spacers 27. The dielectric spacers 27 comprise dielectric materials, but otherwise may be formed using methods analogous to those used for forming the conductor spacers 25. Typically, the dielectric spacers 27 have a thickness from about 10 to about 30 nanometers.

Figure 13:
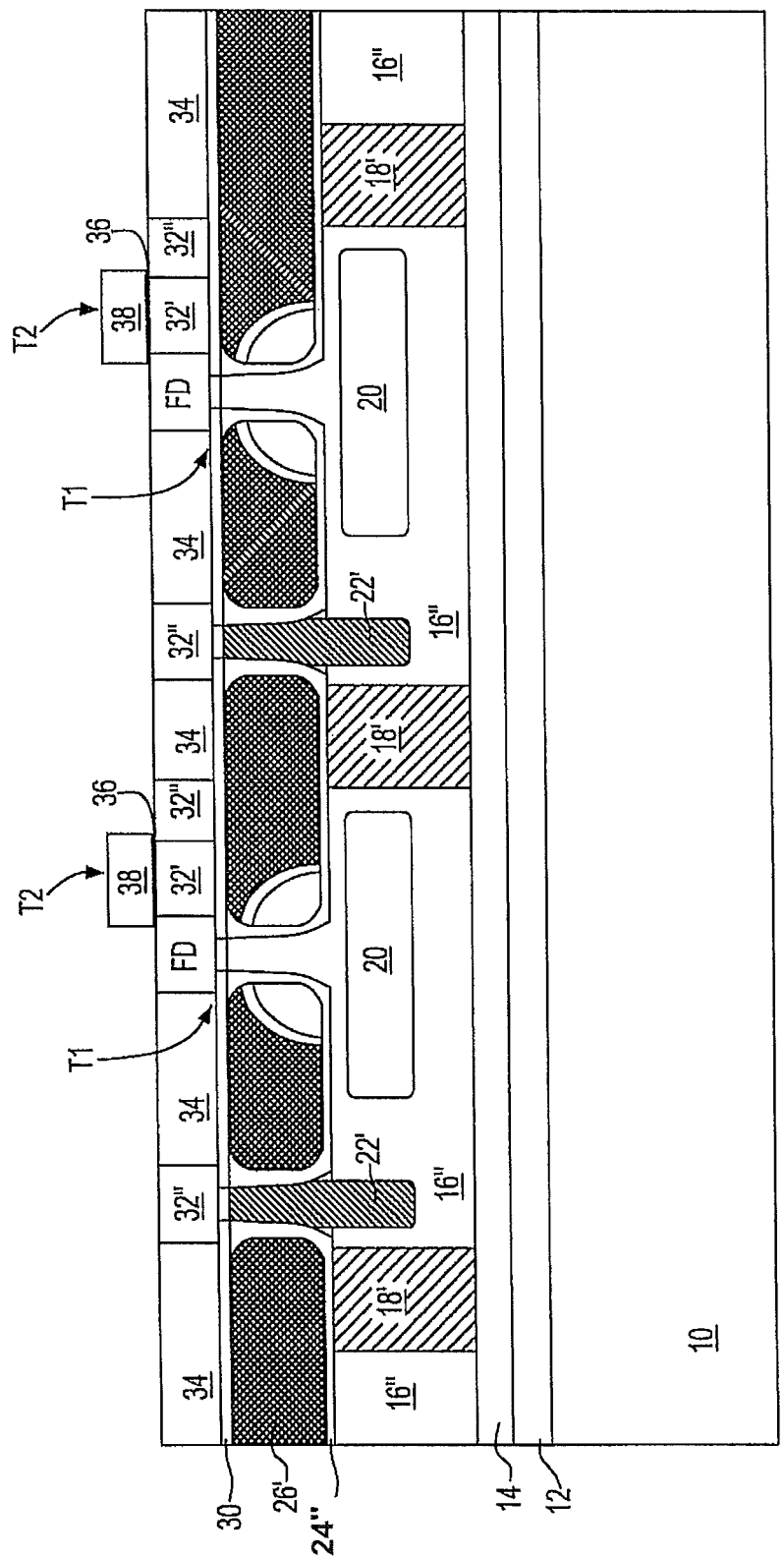

FIG. 13 shows the results of further processing of the semiconductor structure whose schematic cross-sectional diagram is illustrated in FIG. 12. FIG. 13 shows (i.e., at least by implication) conductor layers 28 and dielectric layers 30 that are illustrated in FIG. 7. FIG. 13 also shows channel regions 32', contact regions 32", floating diffusion regions FD and dielectric layers 34 that are also illustrated in FIG. 8, as well as gate dielectrics 36 and gates 38 that are also illustrated in FIG. 8.

FIG. 13 shows a schematic cross-sectional diagram of a semiconductor structure in accordance with a first more specific embodiment derived from the first generalized embodiment of the invention. This particular more specific embodiment also has a light blocking layer 26' interposed between a photo diode region 20 (within a surface semiconductor layer 16' (i.e., a first semiconductor layer)) and a transistor T2 within a second semiconductor layer 32 within the semiconductor structure. This particular embodiment also includes a transistor T1 that is formed at least in part within the surface semiconductor layer 16" and at least in-part, and generally completely, not shielded by the light blocking layer 26'.

Figure 14:
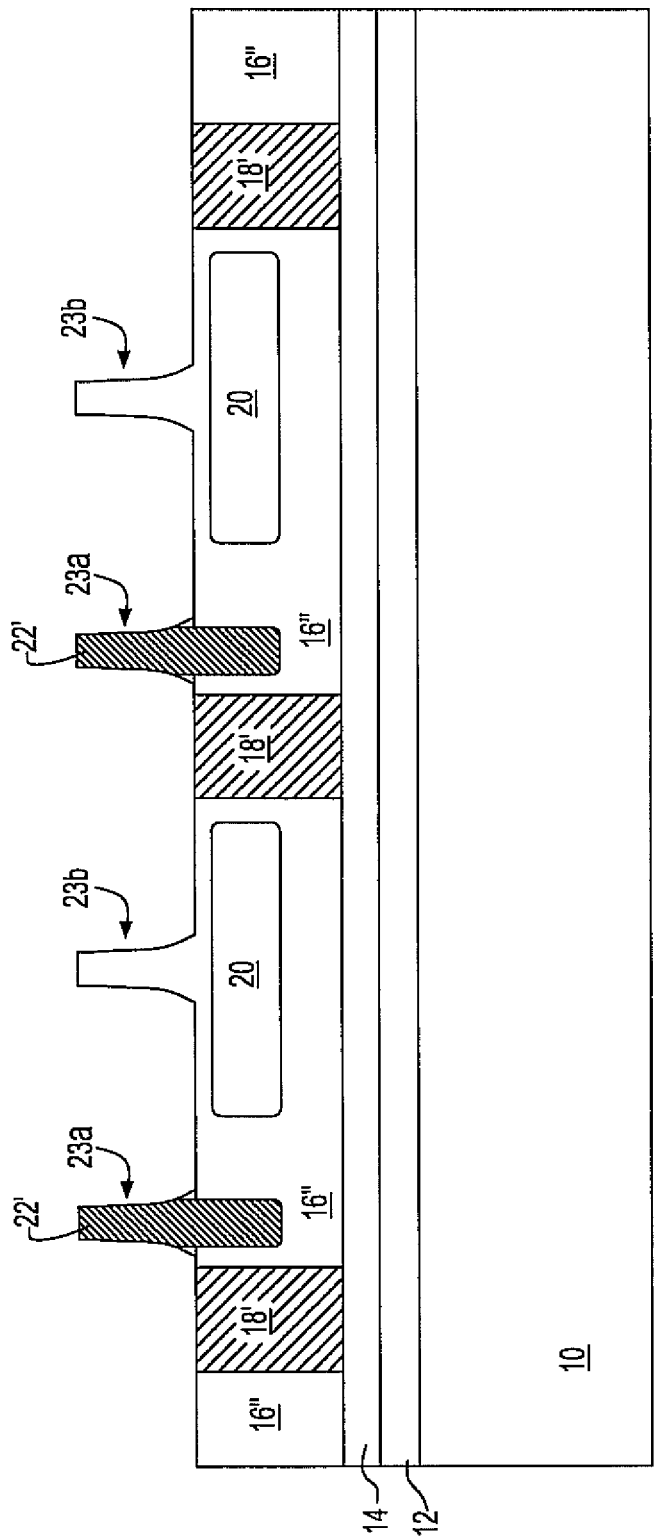
FIG. 14 to FIG. 16 show a series of schematic cross-sectional diagrams illustrating the results of progressive stages in fabricating a CMOS pixel sensor cell within a semiconductor structure in accordance with a second more specific embodiment of the invention that is derived from the first generalized embodiment of the invention.
Figure 15:
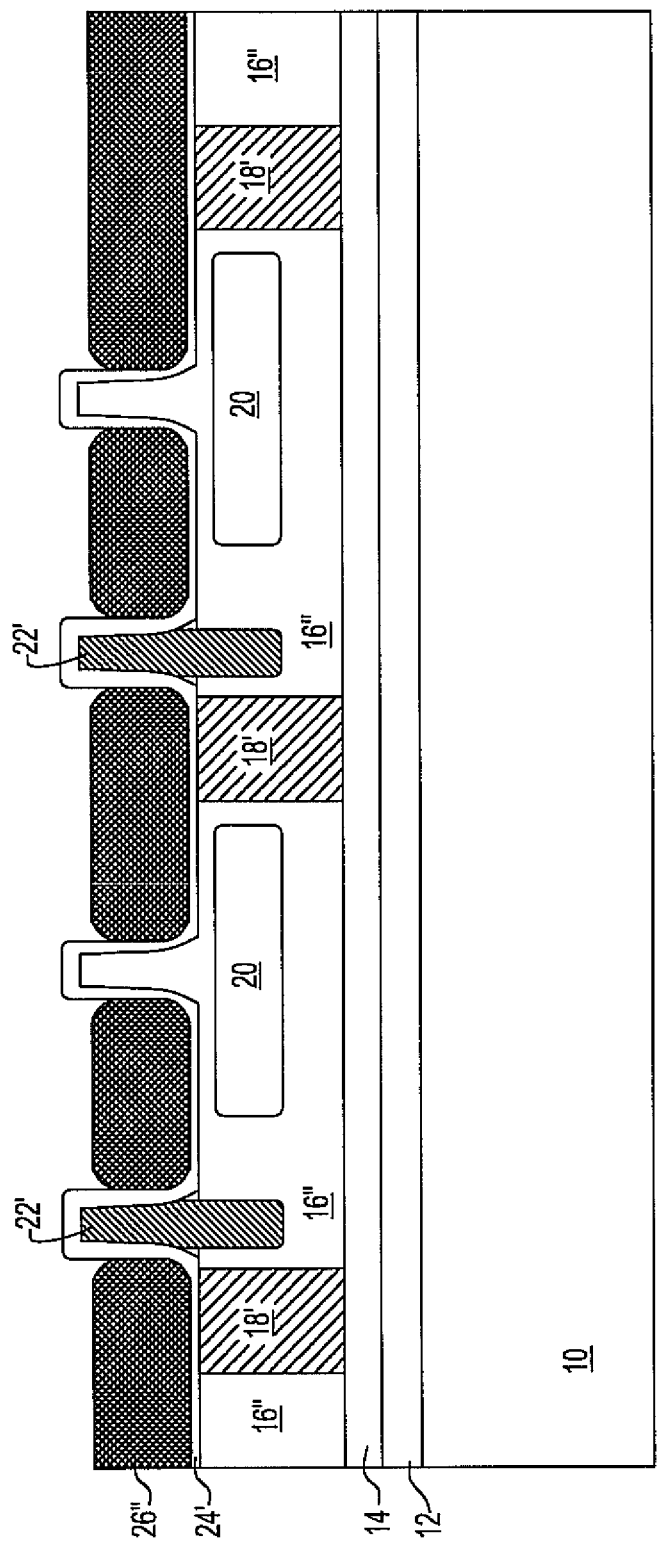
Figure 16:
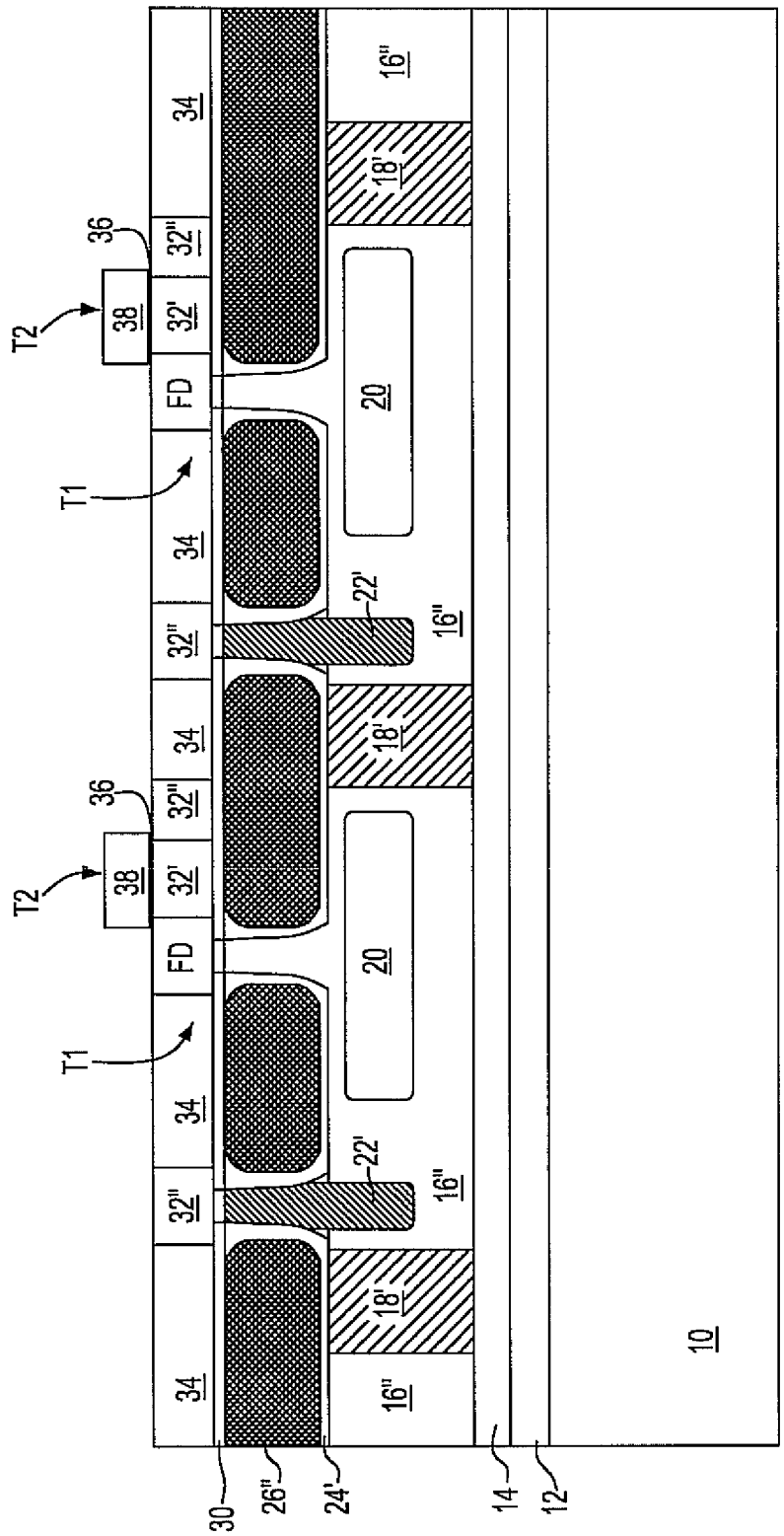

FIG. 14 to FIG. 16 show a series of schematic cross-sectional diagrams illustrating the results of progressive stages in fabricating a semiconductor structure in accordance with a second more specific embodiment of the foregoing first generalized embodiment of the invention.

FIG. 14 corresponds with FIG. 10. Like or identical layers or structures within FIG. 10 and FIG. 14 are designated identically.

FIG. 15 corresponds with FIG. 11 and FIG. 12, but with the absence of the conductor spacers 25 and the dielectric spacers 27, and simply the presence of the light blocking layer 26" that serves as a gate, in addition to a light blocking layer.

FIG. 16 corresponds with FIG. 13, but with the same structural differences that are designated between FIG. 15 and FIG. 11 or FIG. 12. FIG. 16 also designates transistors T1 and transistors T2.

FIG. 16 shows a schematic cross-sectional diagram of a semiconductor structure including a CMOS pixel sensor cell in accordance with a second more specific embodiment of a first generalized embodiment of the invention. The CMOS pixel sensor cell within the semiconductor structure of FIG. 16 otherwise possesses the light shielding advantages of the CMOS pixel sensor cell within the semiconductor structure of FIG. 13, but instead of using separate conductor spacers 25 as a gate, uses the light blocking layer 26" as a gate.

Figure 17:
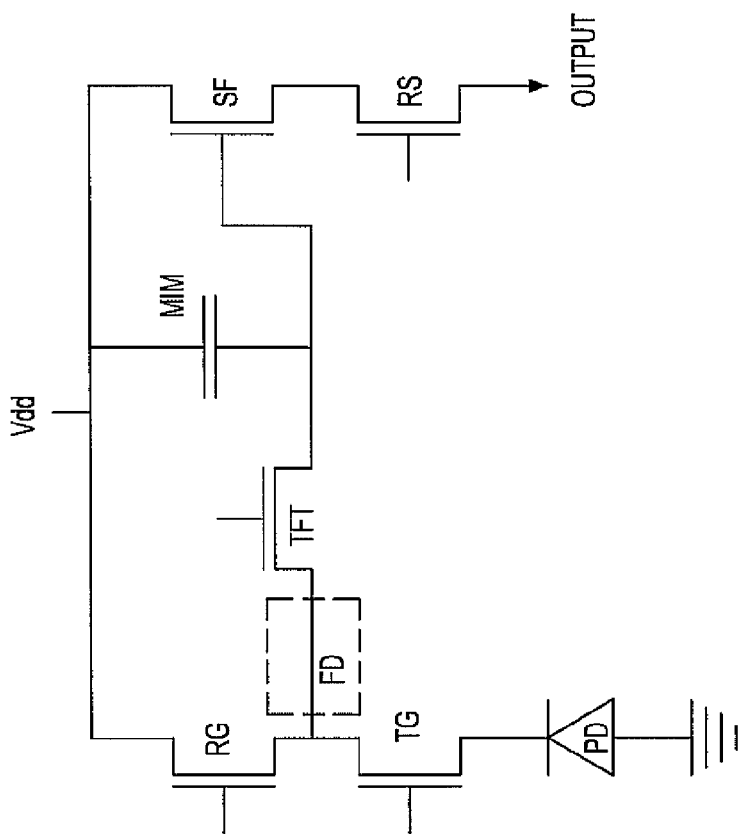
FIG. 17 shows a schematic circuit layout diagram illustrating a CMOS pixel sensor cell in accordance with an additional generalized embodiment of the invention.

FIG. 17 shows a schematic circuit layout diagram of a CMOS pixel sensor cell in accordance with a second generalized embodiment of the invention. FIG. 17 more particularly shows a photodiode PD to whose output is serially connected a transfer gate TG (i.e., in certain instances T1) transistor, a reset gate RG transistor, a source follower SF (i.e., in some instances T2) transistor and a row select RS transistor. As is illustrated in phantom, and in concert with disclosure above, a CMOS pixel sensor cell in accordance with the foregoing first generalized embodiment would include a floating diffusion region FD at a location interposed between the common source and drain region of the transfer gate TG transistor and the reset gate RG transistor, and the gate of the source follower SF transistor. The particular CMOS pixel sensor cell whose schematic circuit layout diagram is illustrated in FIG. 17 is not intended to include a light shield on the floating diffusion region FD, but instead includes a thin film transistor (TFT) and a metal-insulator-metal (MIM) capacitor connected in the fashion as illustrated in FIG. 17. The thin film transistor is connected interposed between the floating diffusion which is the common source and drain region of the transfer gate TG transistor and the reset gate RG transistor and the gate of the source follower SF transistor. The metal-insulator-metal capacitor is electrically connected to the gate of the source follower SF transistor and to the thin film transistor. Thus, this second more generalized embodiment of the invention basically provides an isolated capacitor as a charge storage structure rather than storing the charge on the floating diffusion region FD.

Figure 18:
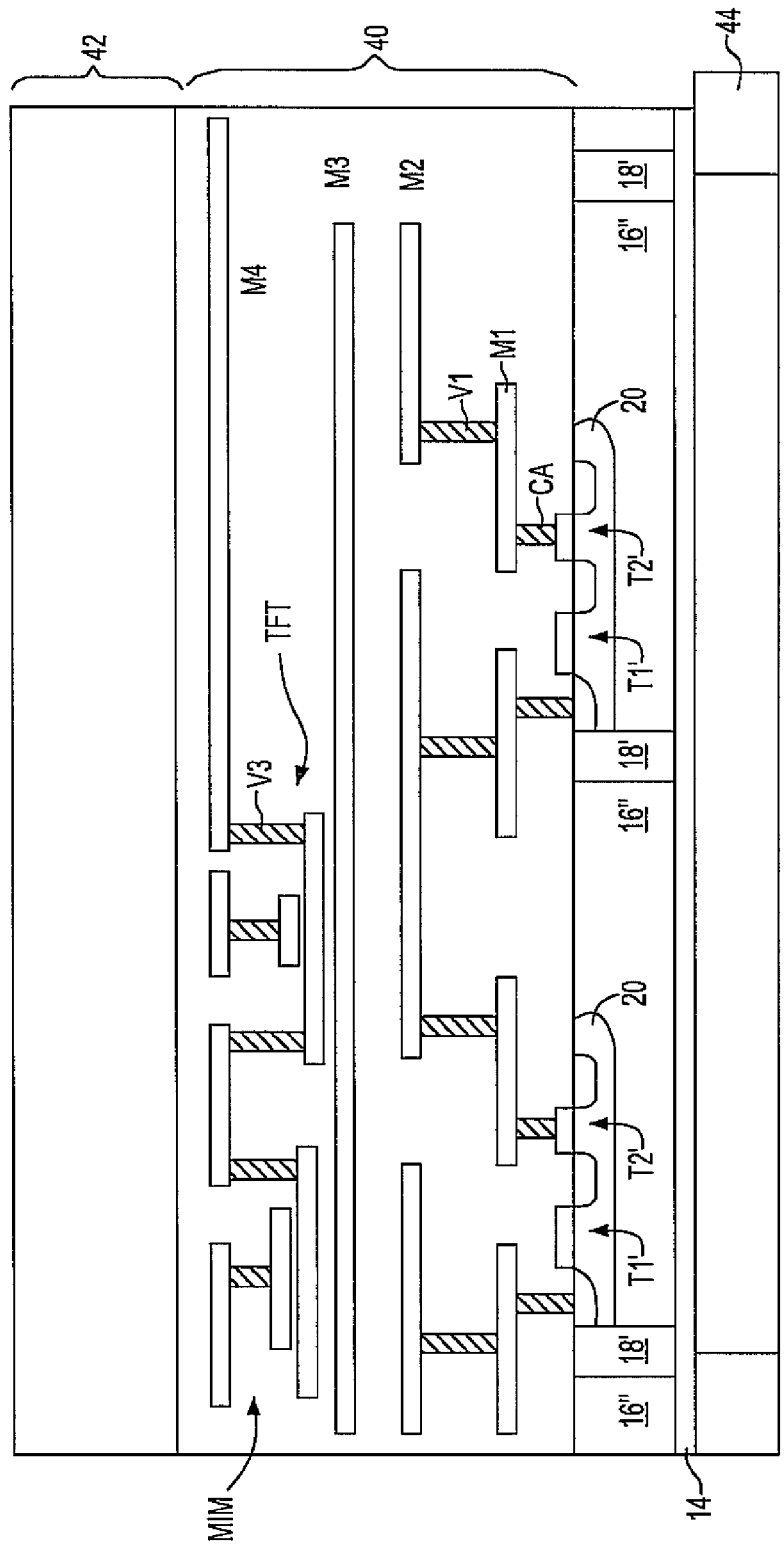
FIG. 18 shows a schematic cross-sectional diagram of a CMOS pixel sensor cell within a semiconductor structure in accordance with the additional generalized embodiment whose schematic circuit layout diagram is illustrated in FIG. 17.

FIG. 18 shows a particular embodiment within a semiconductor structure of the CMOS pixel sensor cell whose schematic circuit layout diagram is illustrated in FIG. 17. FIG. 18 shows the color filter layer 44, the second buried dielectric layer 14, the surface semiconductor layers 16" (i.e., that include the photo diode regions 20, transistors T1' and T2' that may include, but are not necessarily limited to the transfer gate TG transistors and the reset gate RG transistors), the isolation regions 18', the dielectric isolated metallization stack 40 and the carrier substrate 42. Also illustrated within FIG. 18 are the metallization layers M1, M2, M3 and M4 and the via layers CA, V1, V2 and V3 within the dielectric isolated metallization stack 40. FIG. 18 finally shows the metal-insulator-metal (MIM) capacitor and the thin film transistor (TFT). Of importance, this film transistor is shielded from light by an underlying metal layer. In the example of FIG. 18, the M3 layer is used to shield the thin film transistor, but any metal level within the dielectric isolated metallization stack 40 may be used for this purpose.

The semiconductor structure whose schematic cross-sectional diagram is illustrated in FIG. 18 may be fabricated using the same sacrificial substrate layering and carrier substrate laminating method that is illustrated generally in FIG. 3 to FIG. 8, however, only traditional planar transistors are used in the semiconductor layer 16".

FIG. 18 shows a schematic cross-sectional diagram of a semiconductor structure including a CMOS pixel sensor cell in accordance with a second generalized embodiment of the invention. The CMOS pixel sensor cell in accordance with the second generalized embodiment of the invention includes a thin film transistor which connects the floating diffusion to a metal-insulator-metal capacitor. The thin film transistor and the metal-insulator-metal capacitor are shielded by a light blocking layer M3 within a dielectric isolated metallization stack 40.

FIG. 19 shows a block diagram of an exemplary design flow 900 used for example, in semiconductor design, manufacturing, and/or test. Design flow 900 may vary depending on the type of IC being designed. For example, a design flow 900 for building an application specific IC (ASIC) may differ from a design flow 900 for designing a standard component. Design structure 920 is preferably an input to a design process 910 and may come from an IP provider, a core developer, or other design company or may be generated by the operator of the design flow, or from other sources. Design structure 920 comprises an embodiment of the invention as shown in FIG. 9, FIG. 13, FIG. 16 or FIG. 17/18 in the form of schematics or HDL, a hardware-description language (e.g., Verilog, VHDL, C, etc.). Design structure 920 may be contained on one or more machine readable medium. For example, design structure 920 may be a text file or a graphical representation of an embodiment of the invention as shown in FIG. 9, FIG. 13, FIG. 16 or FIG. 17/18. Design process 910 preferably synthesizes (or translates) an embodiment of the invention as shown in FIG. 9, FIG. 13, FIG. 16 or FIG. 17 into a netlist 980, where netlist 980 is, for example, a list of wires, transistors, logic gates, control circuits, I/O, models, etc. that describes the connections to other elements and circuits in an integrated circuit design and recorded on at least one of machine readable medium. This may be an iterative process in which netlist 980 is resynthesized one or more times depending on design specifications and parameters for the circuit.

Design process 910 may include using a variety of inputs; for example, inputs from library elements 930 which may house a set of commonly used elements, circuits, and devices, including models, layouts, and symbolic representations, for a given manufacturing technology (e.g., different technology nodes, 32 nm, 45 nm, 90 nm, etc.), design specifications 940, characterization data 950, verification data 960, design rules 970, and test data files 985 (which may include test patterns and other testing information). Design process 910 may further include, for example, standard circuit design processes such as timing analysis, verification, design rule checking, place and route operations, etc. One of ordinary skill in the art of integrated circuit design can appreciate the extent of possible electronic design automation tools and applications used in design process 910 without deviating from the scope and spirit of the invention. The design structure of the invention is not limited to any specific design flow.

Design process 910 preferably translates an embodiment of the invention as shown in FIG. 9, FIG. 13, FIG. 16 or FIG. 17/18, along with any additional integrated circuit design or data (if applicable), into a second design structure 990. Design structure 990 resides on a storage medium in a data format used for the exchange of layout data of integrated circuits and/or symbolic data format (e.g. information stored in a GDSII (GDS2), GL1, OASIS, map files, or any other suitable format for storing such design structures). Design structure 990 may comprise information such as, for example, symbolic data, map files, test data files, design content files, manufacturing data, layout parameters, wires, levels of metal, vias, shapes, data for routing through the manufacturing line, and any other data required by a semiconductor manufacturer to produce an embodiment of the invention as shown in FIG. 9, FIG. 13, FIG. 16 or FIG. 17/18. Design structure 990 may then proceed to a stage 995 where, for example, design structure 990: proceeds to tape-out, is released to manufacturing, is released to a mask house, is sent to another design house, is sent back to the customer, etc.

Embodiments of the invention are illustrative of the invention rather than limiting of the invention. Revisions or modifications may be made to methods, materials, structures or dimensions of a CMOS pixel sensor cell in accordance with the embodiments while still providing a pixel sensor cell (which need not necessarily be a CMOS pixel sensor cell), method for fabrication thereof or design structure for fabrication thereof in accordance with the invention, further in accordance with the accompanying claims.

What is claimed is:

1. A pixel sensor cell comprising:
    a photoactive region located within a first semiconductor layer, wherein the first semiconductor layer is located a second semiconductor layer;
    a transistor located partially within the second semiconductor layer, wherein the second semiconductor layer is located a carrier substrate;
    a light blocking layer located interposed between the first semiconductor layer and the second semiconductor layer and shielding the transistor from back side illumination; and
    a contact region comprised of a semiconductor material extending through the light blocking layer, wherein the contact region contacts the first semiconductor layer and the second semiconductor layer.

2. The pixel sensor cell of claim 1, further comprising a first transistor located within the first semiconductor layer and not shielded by the light blocking layer.

3. The pixel sensor cell of claim 2, wherein the light blocking layer comprises a gate for the first transistor.

4. The pixel sensor cell of claim 1, further comprising a floating diffusion region that is located within the second semiconductor layer and shielded by the light blocking layer.

5. The pixel sensor cell of claim 1,
    wherein the contact region comprises a first p-dopant concentration from about $1 \times 10^{19}$ to about $5 \times 10^{20}$ p-dopant atoms per cubic centimeter,
    wherein the photoactive region comprises an n-dopant concentration from about $1 \times 10^{15}$ to about $1 \times 10^{17}$ n-dopant atoms per cubic centimeter, and
    wherein the first semiconductor layer comprises a second p-dopant concentration from about $1 \times 10^{13}$ to about $1 \times 10^{16}$ p-dopant atoms per cubic centimeter.

6. A design structure embodied in a non-transitory computer readable storage medium, which when being executed by a computer implements a method for designing, manufacturing, or testing an integrated circuit, the design structure comprising:
    a pixel sensor cell comprising:
        a photoactive region located within a first semiconductor layer, wherein the first semiconductor layer is located on a second semiconductor layer;
        a transistor located partially within the second semiconductor layer, wherein the second semiconductor layer is located on a carrier substrate;
        a light blocking layer located interposed between the first semiconductor layer and the second semiconductor layer and shielding the transistor from back side illumination; and
        a contact region comprised of a semiconductor material extending through the light blocking layer, wherein the contact region contacts the first semiconductor layer and the second semiconductor layer.

* * * * *